(12) United States Patent
Lee

(10) Patent No.: US 7,397,115 B2
(45) Date of Patent: Jul. 8, 2008

(54) FOLDING CHIP PLANAR STACK PACKAGE

(75) Inventor: Ik Jae Lee, Kyoungki-do (KR)

(73) Assignee: Hynix Semiconductor Inc., Kyoungki-go (KR)

( * ) Notice: Subject to any disclaimer, the term of this patent is extended or adjusted under 35 U.S.C. 154(b) by 0 days.

(21) Appl. No.: 11/485,107

(22) Filed: Jul. 12, 2006

(65) Prior Publication Data
US 2007/0228533 A1 Oct. 4, 2007

(30) Foreign Application Priority Data
Mar. 29, 2006 (KR) .................. 10-2006-0028523

(51) Int. Cl.
H01L 23/02 (2006.01)

(52) U.S. Cl. ............. 257/678; 257/686; 257/723; 257/784; 257/778; 257/777

(58) Field of Classification Search ......... 257/666–784; 438/107, 109, 111, 118, 119, 614, 617, 106, 438/110
See application file for complete search history.

(56) References Cited

U.S. PATENT DOCUMENTS

| | | | | |
|---|---|---|---|---|
| 6,072,700 | A * | 6/2000 | Nam ............... | 361/783 |
| 6,225,688 | B1 * | 5/2001 | Kim et al. ........ | 257/686 |
| 6,642,627 | B2 * | 11/2003 | Song et al. ........ | 257/786 |
| 6,670,217 | B2 * | 12/2003 | Milla et al. ...... | 438/107 |
| 6,685,577 | B1 * | 2/2004 | Scruggs et al. .... | 473/349 |
| 6,696,318 | B2 * | 2/2004 | Milla ............. | 438/108 |
| 6,699,730 | B2 * | 3/2004 | Kim et al. ........ | 438/107 |
| 6,879,030 | B2 * | 4/2005 | Tsai et al. ....... | 257/680 |
| 7,053,478 | B2 * | 5/2006 | Roper et al. ...... | 257/686 |
| 7,118,938 | B2 * | 10/2006 | Koh .............. | 438/106 |
| 7,132,754 | B1 * | 11/2006 | Schmidt .......... | 257/778 |
| 7,180,167 | B2 * | 2/2007 | Partridge et al. .. | 257/686 |
| 7,202,555 | B2 * | 4/2007 | Roper et al. ...... | 257/686 |
| 2002/0044423 | A1 * | 4/2002 | Primavera et al. .. | 361/704 |
| 2002/0053732 | A1 * | 5/2002 | Iwaya et al. ...... | 257/723 |
| 2004/0016999 | A1 * | 1/2004 | Misumi ........... | 257/678 |
| 2004/0245617 | A1 * | 12/2004 | Damberg et al. .... | 257/686 |
| 2005/0095745 | A1 * | 5/2005 | Sapir ............. | 438/106 |

FOREIGN PATENT DOCUMENTS

| | | |
|---|---|---|
| JP | 2003-307037 | 10/2003 |
| KR | 1020020085102 | 11/2002 |
| KR | 1020030049577 | 6/2003 |

* cited by examiner

Primary Examiner—Zandra Smith
Assistant Examiner—Telly D Green
(74) Attorney, Agent, or Firm—Ladas & Parry LLP

(57) ABSTRACT

A folding chip planar stack package is realized by employing folding chips. The folding chip planar stack package includes a substrate, first and second semiconductor chips attached to an upper surface of the substrate while being folded and spaced in parallel to each other, a bonding wire for electrically connecting the first and second semiconductor chips with the substrate, a sealing material for sealing the upper surface of the substrate including the first and second semiconductor chips and the bonding wire, and solder balls attached to a lower surface of the substrate.

11 Claims, 6 Drawing Sheets

FOLDING CHIP PLANAR STACK PACKAGE

FIELD OF THE INVENTION

The present invention relates to a stack package. More particularly, the present invention relates to a folding chip planar stack package obtained by folding semiconductor chips.

BACKGROUND OF THE INVENTION

As generally known in the art, semiconductor packages have been developed to have a compact size while improving various electrical characteristics thereof. A representative example of the semiconductor package is a so-called BGA (ball grid array) package. As is known to those of ordinary skill in the art, a BGA package has a size similar to that of a semiconductor chip, so that the mounting space for the BGA package can be minimized. In addition, since the BGA package is electrically connected to external circuits through one or more solder balls on the BGA package, the transmission path between the BGA package solder ball and a semiconductor chip inside the package is kept as short as possible, so that the electrical characteristics of the BGA package can be improved.

Recently, an FBGA (fine-pitch BGA) package has been suggested. The FBGA package not only has the advantages of the BGA package, but also realizes a fine pitch or close spacing of solder balls used for a signal/power input/output pins and is suitable for highly integrated semiconductor devices. FIG. 1 shows a representation of the structure of a typical FBGA package.

As shown in FIG. 1, a conventional BOC (Board On Chip) type FBGA package includes a center pad type semiconductor chip 11 bonded to a substrate 15 having a window by means of an adhesive 13 and provided at a lower portion thereof with a bonding pad 12. In addition, the bonding pad 12 of the semiconductor chip 11, which is exposed through the window of the substrate 15, is connected to a bond finger (not shown) of the substrate 15 through a bonding wire 16. An upper surface of the substrate 15 including the semiconductor chip 11 and the window part of the substrate 15 including the bonding wire 16 are sealed by means of a sealing material 17, such as EMC (epoxy molding compound). In addition, solder balls 18, which are used for mounting the FBGA package on an external circuit, are attached to a ball land (not shown) formed at a lower surface of the substrate 15.

However, according to the above BOC type FBGA package, the window must be formed at the center portion of the substrate so as to wire-bond the bonding pad of the semiconductor chip to the bond finger of the substrate, so that the manufacturing cost for the substrate may increase as compared with that of the substrate, which does not require the window, thereby increasing the manufacturing cost for the BOC type FBGA package. In addition, since only one semiconductor chip is accommodated in the BOC type FBGA package, it is difficult to increase the capacity of the BOC type FBGA package.

In order to increase the capacity of the semiconductor package, as shown in FIG. 2, a chip stack package has been suggested. The chip stack package has a structure similar to that of the above BOC type FBGA package, except that it can theoretically accommodate two semiconductor chips therein but as a practical matter, such a chip stack package requires a bonding wire 26b having a very long length in order to electrically connect an upper semiconductor chip 24 with a substrate 25. As can be seen in FIG. 2, the bonding wire 26b is long and can be easily broken during a packaging molding process. In particular, since transmission paths of electric signals between a lower semiconductor chip 21 and the upper semiconductor chip 24, are different from each other, that is, the lengths of bonding wires 26a and 26b are different from each other, the signal transmission characteristics, such as propagation delays will be different and the operation of the semiconductor chips can be degraded. In addition, if bonding pads are aligned in a dual array structure, it is difficult to variously design the substrate relative to the stack, making it difficult to apply the semiconductor package to a high-speed product.

In FIG. 2, reference numerals 23, 27 and 28 represent an adhesive, a sealing material and solder balls, respectively.

FIG. 3 is a sectional view illustrating a conventional planar stack package. As shown in FIG. 3, the conventional planar stack package includes semiconductor chips 31 and 34 aligned on a substrate 35 in parallel to each other while being sealed by means of a sealing material. Such a planar stack package can be easily fabricated and can improve the signal transmission characteristics because the transmission path for the electric signal between the semiconductor chips 31 and 34 and the substrate 35 can be uniformly established. In addition, since bonding wires 36a and 36b have relatively short lengths, the bonding wires 36a and 36b can be prevented from being broken during the molding process.

However, although the above planar stack package is suitable for edge pad type chips, it is not suitable for center pad type chips. In addition, if the size of the semiconductor chip is enlarged, it is difficult to fabricate the planar stack package. That is, if the size of the semiconductor chip is enlarged, the planar stack package must be fabricated while increasing the size of the substrate corresponding to the size of the semiconductor chip. However, in this case, the mounting space for the planar stack package may be increased, so that the planar stack package has no practical use. In addition, due to the limitation of the mounting space for the planar stack package, it may happen that fabrication of the planar stack package is impossible.

SUMMARY OF THE INVENTION

Accordingly, an object of the present invention is to provide a folding chip planar stack package including a substrate, which has no window, thereby reducing the manufacturing cost thereof.

Another object of the present invention is to provide a folding chip planar stack package having a planar stack structure capable of ensuring superior signal transmission characteristics.

Still another object of the present invention is to provide a folding chip planar stack package having a planar stack structure realized by employing folding chips such that the size of the folding chip planar stack package can be reduced.

Still yet another object of the present invention is to provide a folding chip planar stack package having a planar stack structure, capable of minimizing the mounting space for the folding chip planar stack package.

In order to accomplish these and other objects, there is provided a folding chip planar stack package comprising: a substrate; first and second semiconductor chips attached to an upper surface of the substrate while being folded and spaced in parallel to each other; a bonding wire for electrically connecting the first and second semiconductor chips with the substrate; a sealing material for sealing the upper surface of the substrate including the first and second semiconductor chips and the bonding wire; and solder balls attached to a lower surface of the substrate.

According to the preferred embodiment of the present invention, the substrate is provided at a center portion of the upper surface thereof with a bond finger for electrically connecting the substrate with the first and second semiconductor chips. The first and second semiconductor chips include center pad type chips, which are aligned in parallel on the upper surface of the substrate about a bond finger such that folding surfaces of the first and second chips thereof face each other and in which the bonding pads are attached to the folding surfaces. The bonding pads aligned at the folding surfaces of the first and second semiconductor chips are electrically connected to the bond finger of the substrate through bonding wires.

In addition, bond fingers are provided at outsides of the first and second semiconductor chips attached to the upper surface of the substrate so as to electrically connect the first and second semiconductor chips with the substrate, respectively. Preferably, the first and second semiconductor chips include edge pad type chips, which are aligned on the upper surface of the substrate parallel to each other (also referred to herein as "parallelly") such that folding surfaces thereof face each other and in which the bonding pads are aligned adjacent to the bond fingers of the substrate. The bonding pads of the first and second semiconductor chips, which are adjacent to the bond fingers of the substrate, are electrically connected with the bond fingers of the substrate through bonding wires.

According to the preferred embodiment of the present invention, the bond fingers are provided at a center portion of the upper surface of the substrate and outsides of the first and second semiconductor chips so as to electrically connect the first and second semiconductor chips with the substrate, respectively. The first and second semiconductor chips are parallelly attached to the substrate at outsides of the bond fingers such that folding surfaces of the first and second semiconductor chips face each other, and bonding pads are aligned at a peripheral surface and folding surfaces of the first and second semiconductor chips adjacent to the bond fingers of the substrate, respectively. The bonding pads of the first and second semiconductor chips, which are aligned at the peripheral surface and folding surfaces of the first and second semiconductor chips, are electrically connected with adjacent bond fingers of the substrate through bonding wires.

In addition, first and second tapes are sequentially stacked on the first and second semiconductor chips, respectively, and the first and second semiconductor chips are folded together with the first and second tapes, respectively.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
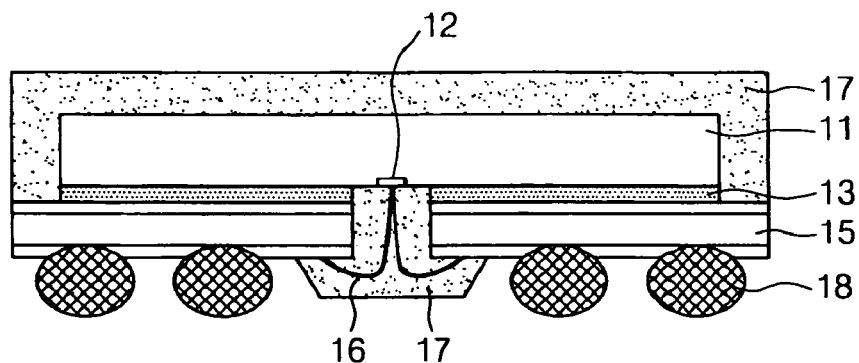
FIG. 1 is a sectional view illustrating a convention BOC (board on chip) type FBGA (fine pitch ball grid array) package.
Figure 2:
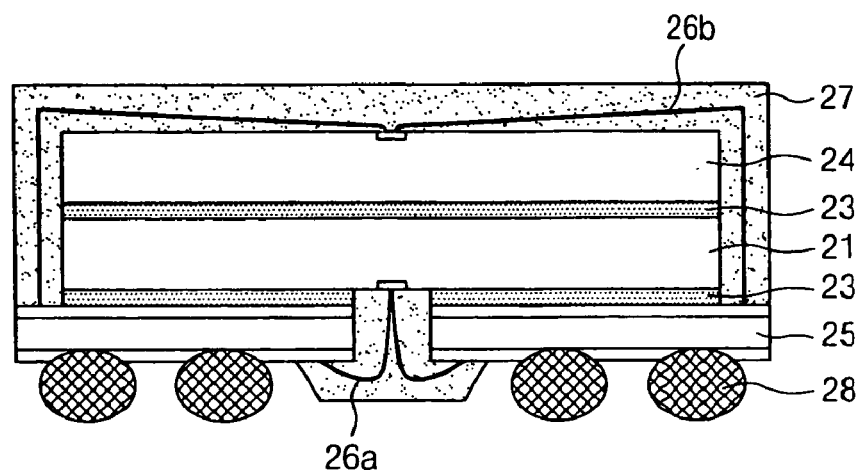
FIG. 2 is a sectional view illustrating a conventional chip stack package.
Figure 3:
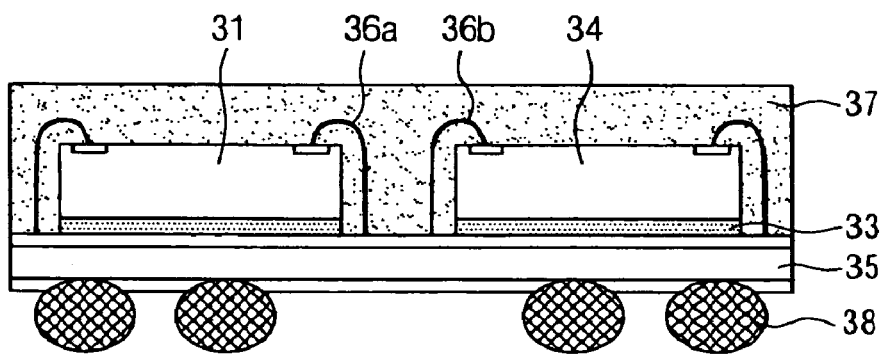
FIG. 3 is a sectional view illustrating a conventional planar stack package.

Hereinafter, a preferred embodiment of the present invention will be described with reference to the accompanying drawings. In the following description and drawings, the same reference numerals are used to designate the same or similar components, so repetition of the description on the same or similar components will be omitted.

Figure 4:
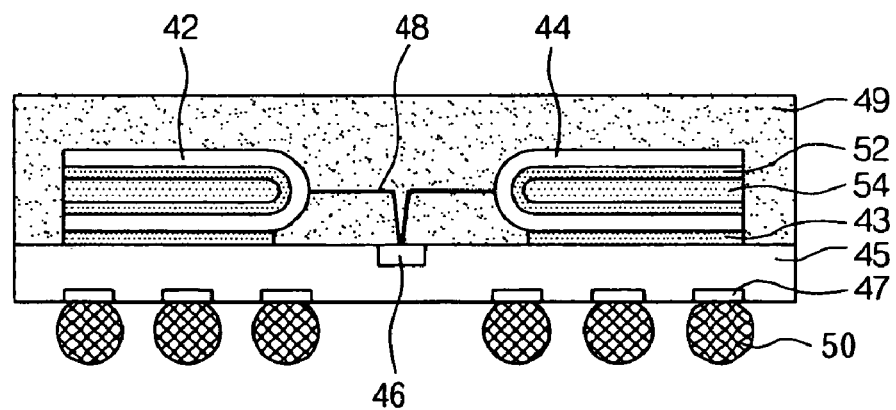
FIG. 4 is a sectional view illustrating a folding chip planar stack package according to one embodiment of the present invention.

Referring now to FIG. 4 there is shown a sectional view of a folding chip planar stack package according to one embodiment of the present invention.

As shown in FIG. 4, the folding chip planar stack package includes a substrate 45, first and second semiconductor chips 42 and 44 attached to an upper surface of the substrate 45 while being spaced in parallel to each other, a plurality of bonding wires 48 for electrically connecting the first and second semiconductor chips 42 and 44 with the electrical contacts on or in the substrate 45, a sealing material 49 for sealing the upper surface of the substrate 45 including the first and second semiconductor chips 42 and 44 and the bonding wire 48, and solder balls 50, which are attached to a lower surface of the substrate 45 so as to mount the folding chip planar stack package on an external circuit (not shown).

Herein, the substrate 45 has a circuit pattern (not shown). In addition, the substrate 45 is formed at the center of the upper surface thereof with an electric terminal, that is, a bond finger 46 such that the substrate 45 can be electrically connected to the first and second semiconductor chips 42 and 44. Ball lands 47 are formed at a lower surface of the substrate 45 and solder balls 50 are attached to the ball lands 47 as shown in the figure.

First and second tapes 52 and 54 are sequentially stacked on each of the first and second semiconductor chips 42 and 44, respectively. In this way, the first and second semiconductor chips 42 and 44 are folded together with the first and second tapes 52 and 54, respectively. The first and second semiconductor chips 42 and 44 are attached to the upper surface of the substrate 45 by means of an adhesive 43 while being parallelly spaced apart from the bond finger 46 in left and right directions respectively, as shown in the figure, in such a manner that the folding surface of the first semiconductor chip 42 faces the folding surface of the second semiconductor chip 44. In particular, the first and second semiconductor chips 42 and 44 are center pad type chips, in which bonding pads (not shown) are provided on the folding surfaces thereof. In addition, the bonding pads provided on the folding surfaces of the first and second semiconductor chips 42 and 44 are electrically connected to the bond finger 46 of the substrate 45 through bonding wires 48. At this time, the bonding wire 48 connecting the first semiconductor chip 42 with the substrate 45 has the length identical to that of the bonding wire 48 connecting the second semiconductor chip 44 with the substrate, so that the bonding wires 48 have the same transmission path for the electric signal, improving the signal transmission characteristics.

The sealing material 49 is provided in order to protect bonding pad regions of the first and second semiconductor chips 42 and 44 and the bonding wires 48 from external impact. The solder balls 50 are attached to the ball lands 47 formed at the lower surface of the substrate 45 and enable the package to be attached to a circuit board or other substrate (not shown).

As mentioned above, the folding chip planar stack package according to the present invention has a face-up type two-layer substrate structure, so that the degree of freedom for the trace routing is increased. Thus, the trace length as well as the number of the bonding wire can be reduced, so that the electrical characteristics of the folding chip planar stack package can be improved. Accordingly, the folding chip planar stack package can be applied to the high-speed product.

Furthermore, since the folding chip planar stack package according to the present invention is obtained by folding the semiconductor chips, the region occupied by the semiconductor chips can be reduced. Therefore, the size of the substrate can be reduced, so that the size of the folding chip planar stack package can also be reduced, thereby minimizing the mounting space required for the folding chip planar stack package.

Hereinafter, the procedure for manufacturing the folding chip planar stack package according to one embodiment of the present invention will be described with reference to FIGS. 5a to 5e.

Figure 5A:
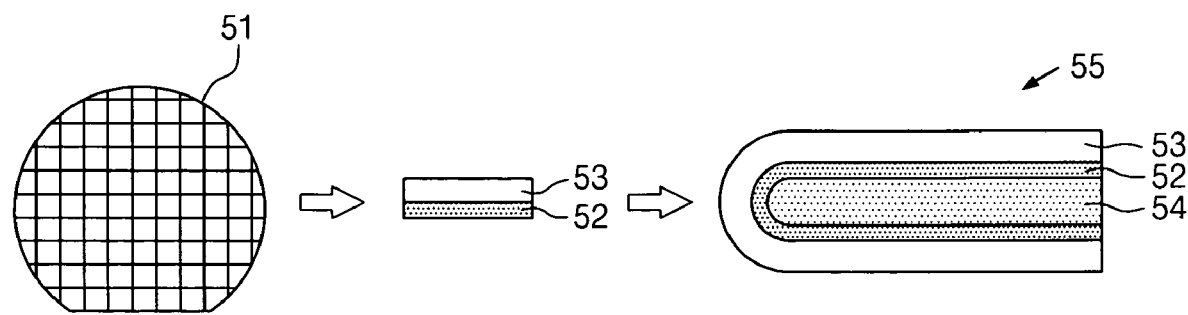
FIGS. 5a to 5d are sectional views illustrating the procedure for manufacturing a folding chip planar stack package according to one embodiment of the present invention.

Referring to FIG. 5a, in a state in which the first tape 52 is attached to a rear surface of a wafer 51, a sawing process is performed with respect to the wafer 51, thereby dividing the wafer 51 into several individual chips 53, each of which has a correspondingly sawn portion of first tape 52 attached to its rear surface. After sawing, the second tape 54 is attached to a half portion of a rear surface of the chip 53.

In this state, the chip 53 is folded such that the first tape 52 remaining at the other half portion of the rear surface of the chip 53, to which the second tape 54 is not attached, can be bonded to the second tape 54, thereby preparing a folding chip 55 according to the present invention.

Herein, the second tape 54 is used for reducing the stress applied to the chip 53 when the chip 53 is folded. Accordingly, the chip 53 can be folded without attaching the second tape 52 to the chip 53. At this time, although it is not illustrated, the bonding pad is provided at the folding surface of the folding chip 55.

Figure 5B:
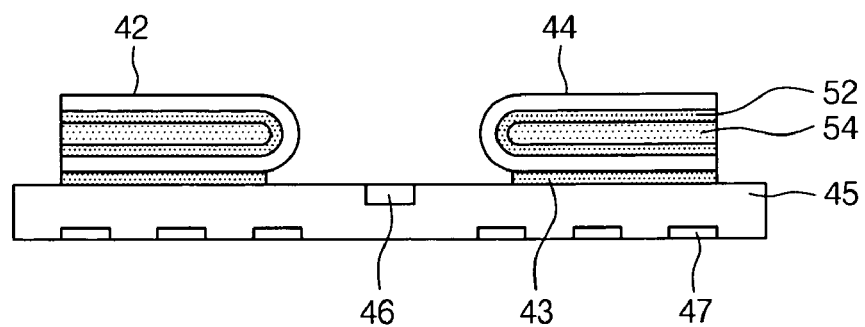

Referring to FIG. 5b, folding chips 55 (hereinafter, referred to as first and second semiconductor chips 42 and 44) are bonded to the upper surface of the substrate 45, which is formed at the center portion of the upper surface thereof with the bond finger 46 and at the lower surface thereof with the ball lands 47, by means of an adhesive 53 in such a manner that the first and second semiconductor chips 42 and 44 are spaced in parallel to each other. At this time, the first and second semiconductor chips 42 and 44 are aligned at left and right sides of the substrate 45 about the bond finger 46.

Figure 5C:
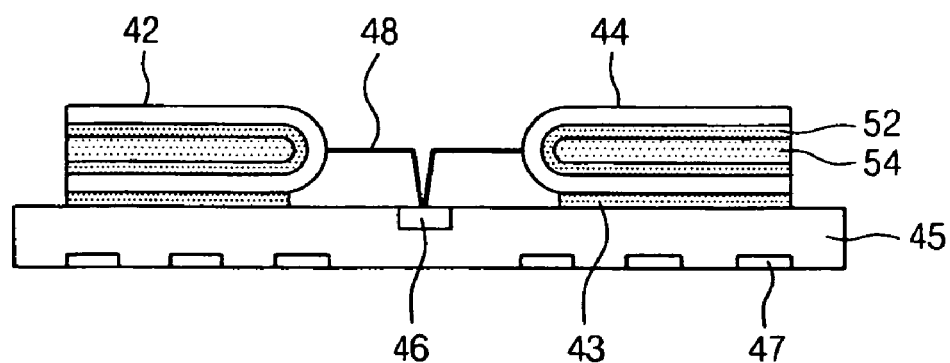

Referring to FIG. 5c, a wire bonding process is performed with respect to the resultant structure, thereby connecting the bonding pads aligned at the folding surfaces of the first and second semiconductor chips 42 and 44 with the bond finger 46 of the substrate 45 by using the bonding wires 48. Preferably, the wire bonding is vertically performed.

Figure 5D:
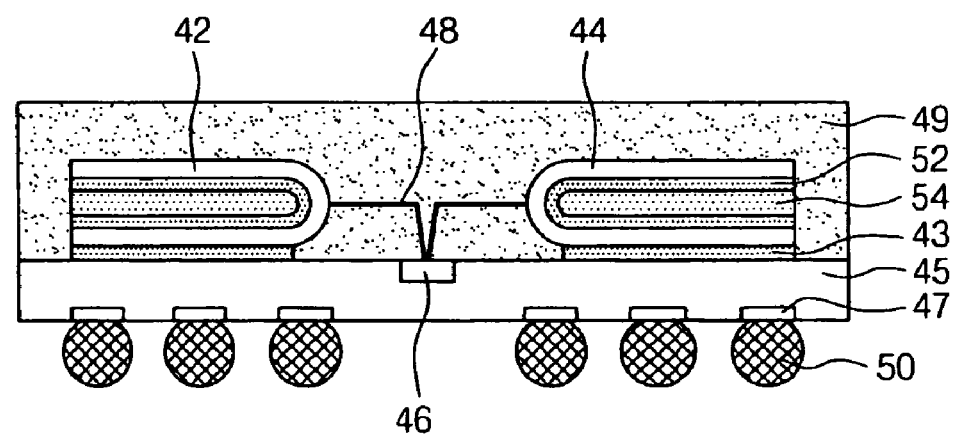

Referring to FIG. 5d, the upper surface of the substrate 45 including the first and second semiconductor chips 42 and 44 and the bonding wires 48 is sealed by means of the sealing material 49 including EMC in order to protect the first and second semiconductor chips 42 and 44 and the bonding wires 48 from external impact. After that, the solder balls 50, which are used for mounting the folding chip planar stack package on the external circuit, are attached to the ball lands 47 formed at the lower surface of the substrate 45, thereby obtaining the folding chip planar stack package according to the present invention.

Meanwhile, although the above embodiment has been described that the center pad type chips and the bond finger are aligned on the center portion of the substrate, according to another embodiment of the present invention, edge pad type chips can be used, instead of the center pad type chips. In addition, it is also possible to align the bond finger of the substrate at the outside of the semiconductor chips.

Figure 6:
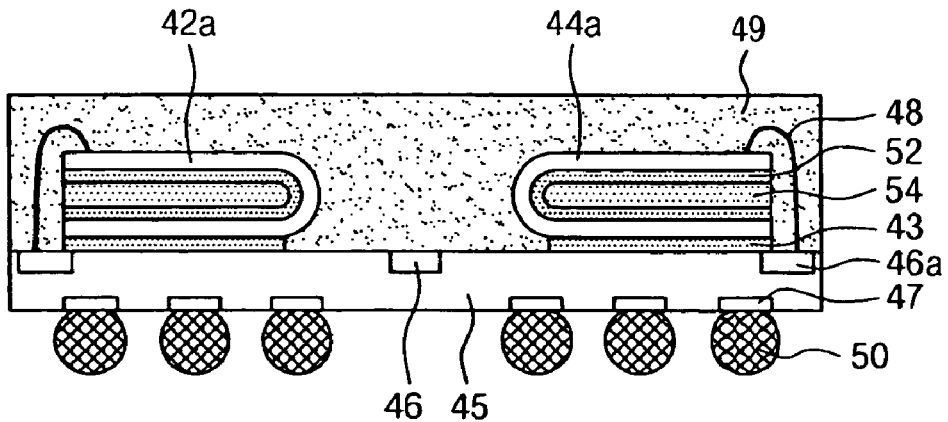
FIG. 6 to 8 are sectional views illustrating folding chip planar stack packages according to another embodiment of the present invention.

FIG. 6 is sectional view illustrating the folding chip planar stack package according to another embodiment of the present invention. As shown in FIG. 6, first and second semiconductor chips 42a and 44a are in the form of edge pad type chips. In addition, different from the previous embodiment, in which the bond finger is aligned on the center portion of the upper surface of the substrate 45, bond fingers 46a of the substrate 45 are aligned at the outside of the first and second semiconductor chips 42a and 44a, respectively. In addition, the bonding wires 48 are also aligned at the outside of the first and second semiconductor chips 42a and 44a, rather than the center portion of the upper surface of the substrate 45. The structure and alignment of remaining components are identical to those of the previously described embodiment.

Figure 7:
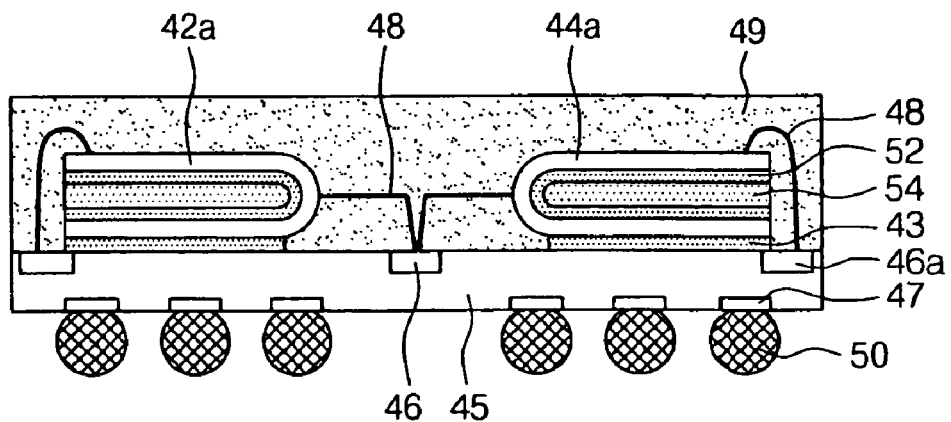

FIG. 7 is sectional view illustrating the folding chip planar stack package according to still another embodiment of the present invention. As shown in FIG. 7, first and second semiconductor chips 42b and 44b have dual alignment structures, in which bonding pads are aligned at both the center and edge portions of the first and second semiconductor chips 42b and 44b. In this case, bond fingers 46 and 46a of the substrate 45 are aligned at the center portion and the outside of the first and second semiconductor chips 42b and 44b corresponding to the bonding pads, respectively. In addition, the bonding wires 48 are aligned such that they can connect the bonding pads of the first and second semiconductor chips 42b and 44b with the bond fingers 46 and 46a of the substrate 45 at the center portion of the substrate 45 and the outside of the first and second semiconductor chips 42b and 44b, respectively.

Figure 8:
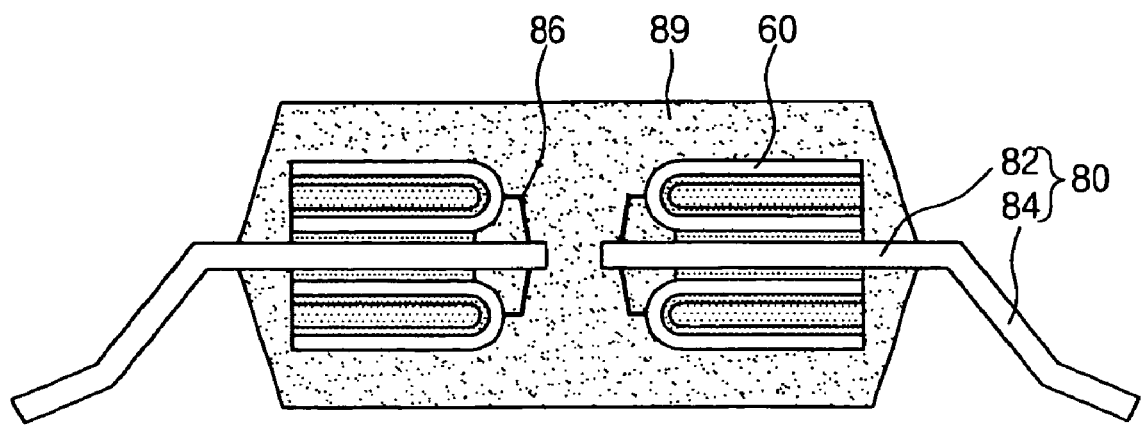

FIG. 8 is sectional view illustrating the folding chip planar stack package according to still yet another embodiment of the present invention. As shown in FIG. 8, the folding chip planar stack package according to still yet another embodiment of the present invention is different from the folding chip planar stack packages of the previous embodiments in that a lead frame 80 is employed instead of the substrate and semiconductor chips 60 are attached to upper and lower surfaces of an inner lead 82 of the lead frame 80, respectively. In addition, bonding pads (not shown) aligned at folding surfaces of the semiconductor chips 60 are connected to adjacent inner leads through boding wires 86, respectively. Furthermore, the lead frame 80 is sealed by means of a sealing member 90, except for an outer lead 84 of the lead frame 80.

The folding chip planar stack package employing the lead frame has the advantageous identical to those of the previous embodiments.

As described above, the folding chip planar stack package according to the present invention is obtained by using a planar stack so that the folding chip planar stack package can be easily fabricated. In addition, the folding chip planar stack package according to the present invention is suitable for both the center pad type chips and the edge pad type chips. The present invention is not necessary to form a window in the substrate, so that the manufacturing cost for the folding chip planar stack package can be reduced. In addition, the present invention can improve the degree of freedom when designing the substrate, so that he folding chip planar stack package can be applied to the high-speed product. Since the folding chip planar stack package according to the present invention is fabricated by folding the semiconductor chips, the region occupied by the semiconductor chips can be reduced, so that the size of the substrate and the semiconductor package can be reduced. Thus, the mounting surface for the semiconductor package can be minimized.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A folding chip planar stack package comprising:
    a substrate;
    first and second folded semiconductor chips attached to an upper surface of the substrate spaced in parallel to each other;
    a bonding wire electrically connecting the first and second folded semiconductor chips with the substrate;
    a sealing material sealing the upper surface of the substrate including the first and second folded semiconductor chips and the bonding wire; and
    solder balls attached to a lower surface of the substrate.

2. The folding chip planar stack package as claimed in claim 1, wherein the substrate is provided at a center portion of the upper surface thereof with a bond finger for electrically connecting the substrate with the first and second folded semiconductor chips.

3. The folding chip planar stack package as claimed in claim 2, wherein the first and second folded semiconductor chips include center pad type chips, which are parallelly aligned on the upper surface of the substrate about a bond finger such that folding surfaces thereof face each other.

4. The folding chip planar stack package as claimed in claim 3, wherein the bonding pads aligned at the folding surfaces of the first and second folded semiconductor chips are electrically connected to the bond finger of the substrate through bonding wires.

5. The folding chip planar stack package as claimed in claim 1, wherein bond fingers are provided at outsides of the first and second folded semiconductor chips attached to the upper surface of the substrate so as to electrically connect the first and second folded semiconductor chips with the substrate, respectively.

6. The folding chip planar stack package as claimed in claim 5, wherein the first and second folded semiconductor chips include edge pad type chips, which are parallelly aligned on the upper surface of the substrate such that folding surfaces thereof face each other and in which the bonding pads are aligned adjacent to the bond fingers of the substrate.

7. The folding chip planar stack package as claimed in claim 6, wherein bonding pads of the first and second folded semiconductor chips, which are adjacent to the bond fingers of the substrate, are electrically connected with the bond fingers of the substrate through bonding wires.

8. The folding chip planar stack package as claimed in claim 1, wherein bond fingers are provided at a center portion of the upper surface of the substrate and outsides of the first and second folded semiconductor chips so as to electrically connect the first and second folded semiconductor chips with the substrate, respectively.

9. The folding chip planar stack package as claimed in claim 8, wherein the first and second folded semiconductor chips are parallelly attached to the substrate at outsides of the bond fingers such that folding surfaces of the first and second folded semiconductor chips face each other, and bonding pads are aligned at a peripheral surface and folding surfaces of the first and second folded semiconductor chips adjacent to the bond fingers of the substrate, respectively.

10. The folding chip planar stack package as claimed in claim 9, wherein bonding pads of the first and second folded semiconductor chips, which are aligned at the peripheral surface and folding surfaces of the first and second folded semiconductor chips, are electrically connected with adjacent bond fingers of the substrate through bonding wires.

11. The folding chip planar stack package as claimed in claim 1, wherein first and second tapes are sequentially stacked on the first and second folded semiconductor chips, respectively, and the first and second folded semiconductor chips are folded together with the first and second tapes, respectively.

* * * * *